US011737234B2

(12) United States Patent
Yao

(10) Patent No.: US 11,737,234 B2
(45) Date of Patent: Aug. 22, 2023

(54) MOUNTING KIT ADAPTED FOR A RAIL COMPONENT AND RELATED RAIL MOUNTING SYSTEM

(71) Applicant: Moxa Inc., New Taipei (TW)

(72) Inventor: Min-Heng Yao, New Taipei (TW)

(73) Assignee: Moxa Inc., New Taipei (TW)

( * ) Notice: Subject to any disclaimer, the term of this patent is extended or adjusted under 35 U.S.C. 154(b) by 120 days.

(21) Appl. No.: 17/491,481

(22) Filed: Sep. 30, 2021

(65) Prior Publication Data
US 2022/0304183 A1 Sep. 22, 2022

Related U.S. Application Data

(60) Provisional application No. 63/163,054, filed on Mar. 19, 2021.

(30) Foreign Application Priority Data

Aug. 11, 2021 (TW) .................................. 110129569

(51) Int. Cl.
| H05K 7/18 | (2006.01) |
| A47B 96/06 | (2006.01) |
| H05K 7/14 | (2006.01) |

(52) U.S. Cl.
CPC ........... H05K 7/183 (2013.01); A47B 96/067 (2013.01); H05K 7/1489 (2013.01)

(58) Field of Classification Search
CPC ........ H05K 7/183; H05K 7/14; H05K 7/1489; A47B 96/067
See application file for complete search history.

(56) References Cited

U.S. PATENT DOCUMENTS

| 5,904,592 A * | 5/1999 | Baran .................... H02B 1/052 |
| | | 361/627 |
| 6,038,130 A * | 3/2000 | Boeck .................... H02B 1/052 |
| | | 361/732 |

(Continued)

FOREIGN PATENT DOCUMENTS

| CN | 209964470 U | 1/2020 |
| DE | 6601556 | 3/1969 |

(Continued)

*Primary Examiner* — Eret C McNichols
(74) *Attorney, Agent, or Firm* — Winston Hsu

(57) ABSTRACT

A mounting kit adapted for a rail component is provided and includes a mounting base, a resilient component and an engaging structure. An accommodating slot is formed on a first end portion of the mounting base. The resilient component is a one-piece structure and detachably and partially accommodated in the accommodating slot. The engaging structure is formed on a second end portion of the mounting base. When the mounting kit is mounted on the rail component, the resilient component is resiliently deformed by the rail component and a wall of the accommodating slot, so as to drive the rail component to engage with the engaging structure along a vertical direction and to abut against a connecting portion of the mounting base for preventing shaking movements of the mounting kit relative to the rail component along the vertical direction and the horizontal direction. Besides, a related rail mounting system is provided.

16 Claims, 10 Drawing Sheets

(56) References Cited

U.S. PATENT DOCUMENTS

| | | | | |
|---|---|---|---|---|
| 7,073,971 | B2 * | 7/2006 | Schurr | H05K 7/1474 |
| | | | | 439/94 |
| 7,374,453 | B1 * | 5/2008 | Allcock | E01B 9/38 |
| | | | | 439/716 |
| 8,651,442 | B2 * | 2/2014 | Takaya | H02B 1/052 |
| | | | | 248/228.7 |
| 9,088,138 | B2 * | 7/2015 | Yu | H02B 1/0523 |
| 10,306,796 | B2 * | 5/2019 | Huang | G06F 1/183 |
| 10,716,235 | B1 * | 7/2020 | Farnsworth | H05K 7/1474 |
| 11,096,310 | B2 * | 8/2021 | Kutsche | H02B 1/0523 |
| 2010/0216334 | A1 * | 8/2010 | Christmann | H02B 1/052 |
| | | | | 439/532 |

FOREIGN PATENT DOCUMENTS

| | | | |
|---|---|---|---|
| DE | 24 29 982 A1 | | 1/1976 |
| DE | 2742784 A1 | * | 5/1978 |
| DE | 136 444 | | 7/1979 |
| DE | 298 06 323 U1 | | 8/1998 |
| DE | 198 15 452 C1 | | 5/2000 |
| TW | M418520 U1 | | 12/2011 |

* cited by examiner

MOUNTING KIT ADAPTED FOR A RAIL COMPONENT AND RELATED RAIL MOUNTING SYSTEM

CROSS REFERENCE TO RELATED APPLICATIONS

This application claims the benefit of U.S. Provisional Application No. 63/163,054, filed on Mar. 19, 2021, and Taiwan Application No. 110129569, filed on Aug. 11, 2021, and the entire contents of which are hereby incorporated by reference.

BACKGROUND OF THE INVENTION

1. Field of the Invention

The present invention relates to a mounting kit and a related mounting system, and more specifically, to a mounting kit adapted for a rail component, and a related rail mounting system.

2. Description of the Prior Art

Cabinets or racks usually utilize rail mounting systems including rails and mounting kits for mounting appliances, such as circuit breakers or terminal blocks. The rails are disposed on the cabinets or the racks. The mounting kits are detachably installed on the rails for supporting such appliances. By assembly and disassembly of the mounting kits and the rails, it is easy for a user to achieve installation or removal of such appliances relative to the cabinets or the racks. However, the conventional mounting kits have poor structural reliability due to resonance problems.

SUMMARY OF THE INVENTION

Therefore, it is an objective to provide amounting kit adapted for a rail component, and a related rail mounting system for solving the aforementioned problems.

In order to achieve the aforementioned objective, the present invention discloses a mounting kit adapted for a rail component. The mounting kit includes a mounting base, a resilient component and an engaging structure. The mounting base includes a first end portion, a second end portion and a connecting portion connected to the first end portion and the second end portion. An accommodating slot is formed on the first end portion of the mounting base. The resilient component is a one-piece structure and partially accommodated in the accommodating slot in a detachable manner. The engaging structure is formed on the second end portion of the mounting base. When the mounting kit is mounted on the rail component, the resilient component is resiliently deformed by the rail component and a wall of the accommodating slot to generate a vertical resilient component force and a horizontal resilient component force, so as to drive the rail component to engage with the engaging structure along a vertical direction by the vertical resilient component force for preventing a shaking movement of the mounting kit along the vertical direction and to drive the rail component to abut against the engaging structure along a horizontal direction by the horizontal resilient component force for preventing a shaking movement of the mounting kit along the horizontal direction.

According to an embodiment of the present invention, the resilient component includes at least one inclined extending portion extending toward the connecting portion along an inclined direction inclined relative to the vertical direction and the horizontal direction.

According to an embodiment of the present invention, the resilient component further includes an accommodating portion connected to the at least one inclined extending portion and extending along the vertical direction.

According to an embodiment of the present invention, an abutting portion of the at least one inclined extending portion abuts against the rail component when the mounting kit is mounted on the rail component.

According to an embodiment of the present invention, a projection length of the at least one inclined extending portion along the horizontal direction is from 0.5 to 0.9 millimeters.

According to an embodiment of the present invention, the connecting portion includes an abutting structure protruding from a side of the connecting portion adjacent to the rail component along the horizontal direction and configured to abut against the rail component along the horizontal direction.

In order to achieve the aforementioned objective, the present invention further discloses a rail mounting system. The rail mounting system includes a rail component and a mounting kit for mounting on the rail component. The mounting kit includes a mounting base, a resilient component and an engaging structure. The mounting base includes a first end portion, a second end portion and a connecting portion connected to the first end portion and the second end portion. An accommodating slot is formed on the first end portion of the mounting base. The resilient component is a one-piece structure and partially accommodated in the accommodating slot in a detachable manner. The engaging structure is formed on the second end portion of the mounting base. When the mounting kit is mounted on the rail component, the resilient component is resiliently deformed by the rail component and a wall of the accommodating slot to generate a vertical resilient component force and a horizontal resilient component force, so as to drive the rail component to engage with the engaging structure along a vertical direction by the vertical resilient component force for preventing a shaking movement of the mounting kit along the vertical direction and to drive the rail component to abut against the engaging structure along a horizontal direction by the horizontal resilient component force for preventing a shaking movement of the mounting kit along the horizontal direction.

According to an embodiment of the present invention, the resilient component includes at least one inclined extending portion extending toward the connecting portion along an inclined direction inclined relative to the vertical direction and the horizontal direction.

According to an embodiment of the present invention, the resilient component further includes an accommodating portion connected to the at least one inclined extending portion and extending along the vertical direction.

According to an embodiment of the present invention, an abutting portion of the at least one inclined extending portion abuts against the rail component when the mounting kit is mounted on the rail component.

According to an embodiment of the present invention, a projection length of the at least one inclined extending portion along the horizontal direction is from 0.5 to 0.9 millimeters.

According to an embodiment of the present invention, the connecting portion includes an abutting structure protruding from a side of the connecting portion adjacent to the rail component along the horizontal direction and configured to abut against the rail component along the horizontal direction.

In summary, the present invention utilizes the resilient component for generating the vertical resilient component force and the horizontal resilient component force to drive the rail component to engage with the engaging structure along the vertical direction and to abut against the connecting portion of the mounting base along the horizontal direction, so as to prevent the shaking movements of the mounting kit relative to the rail component along the vertical direction and the horizontal direction. The aforementioned configuration can effectively prevent resonance of the mounting kit, and therefore, the present invention has better structural reliability.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, the term "connect" is intended to mean either an indirect or direct mechanical connection. Thus, if a first device is connected to a second device, that connection may be through a direct mechanical connection, or through an indirect mechanical connection via other devices and connections.

Figure 1:
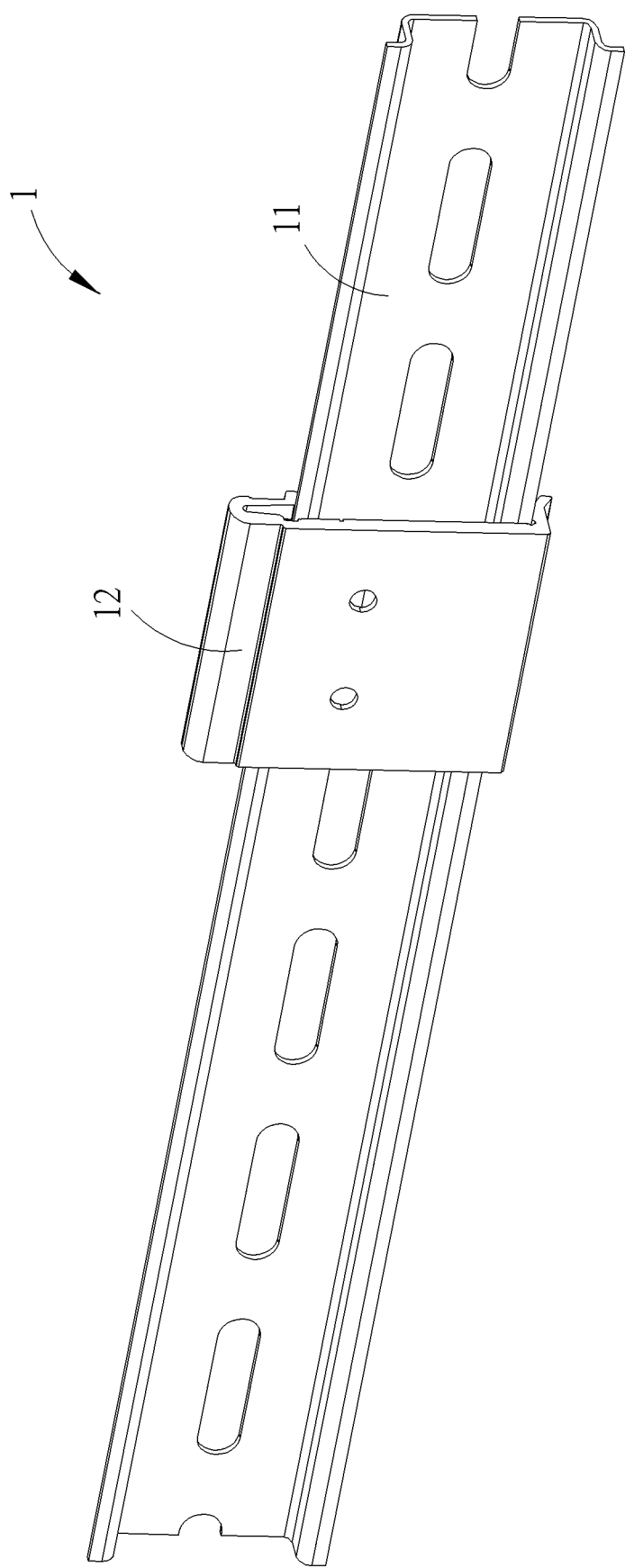
FIG. 1 and FIG. 2 are schematic diagrams of a rail mounting system at different views according to an embodiment of the present invention.
Figure 2:
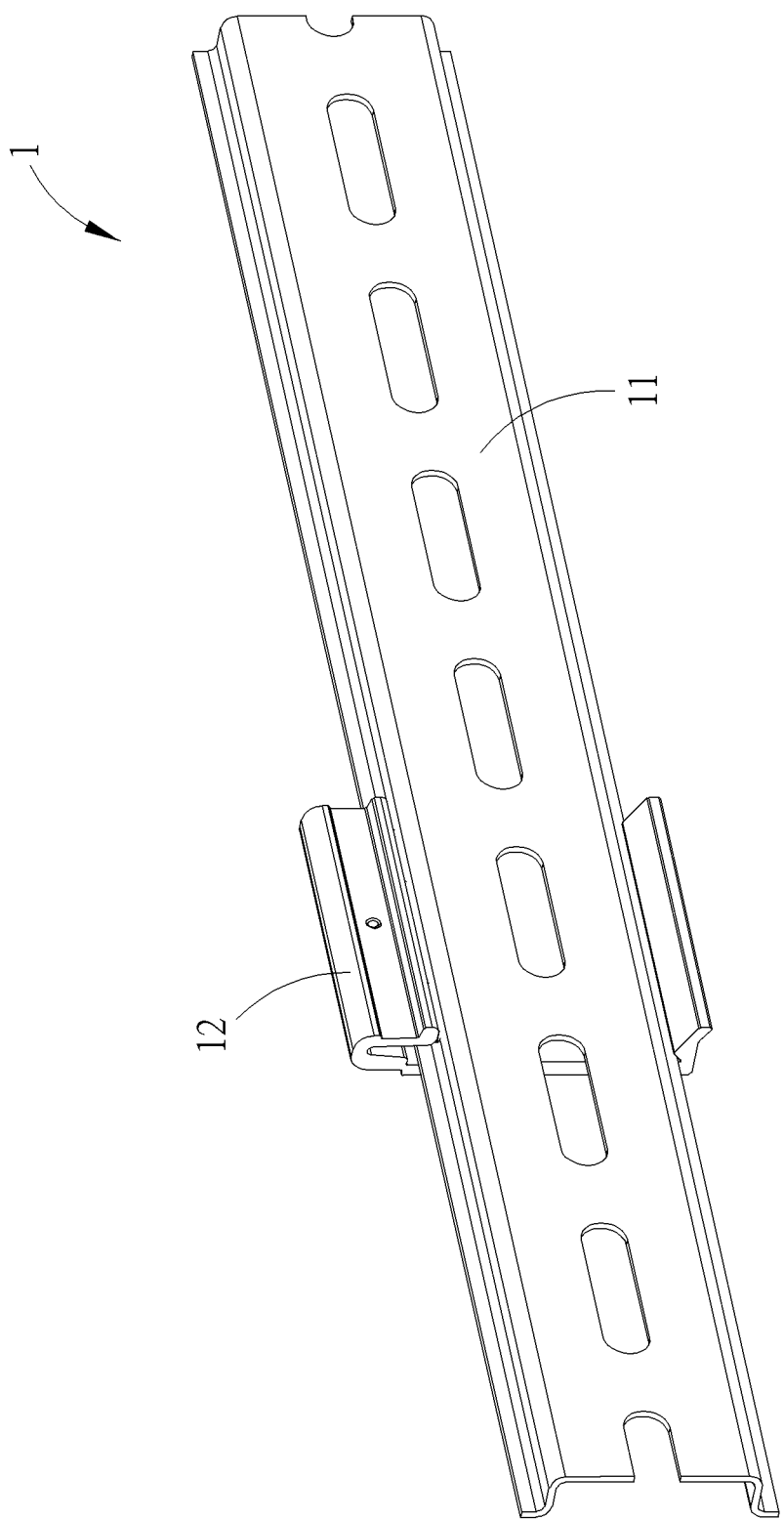
Figure 3:
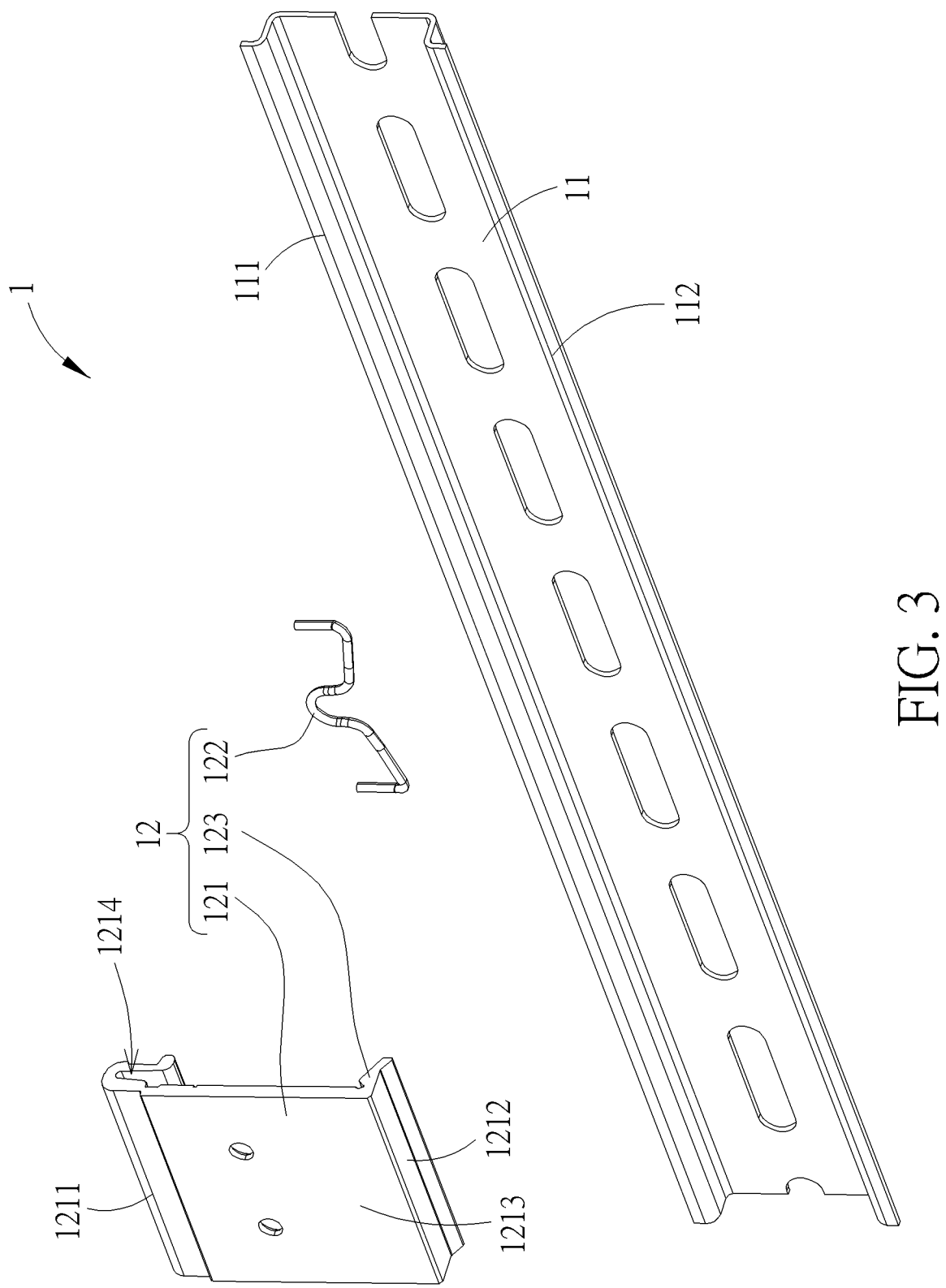
FIG. 3 and FIG. 4 are exploded diagrams of the rail mounting system at different views according to the embodiment of the present invention.
Figure 4:
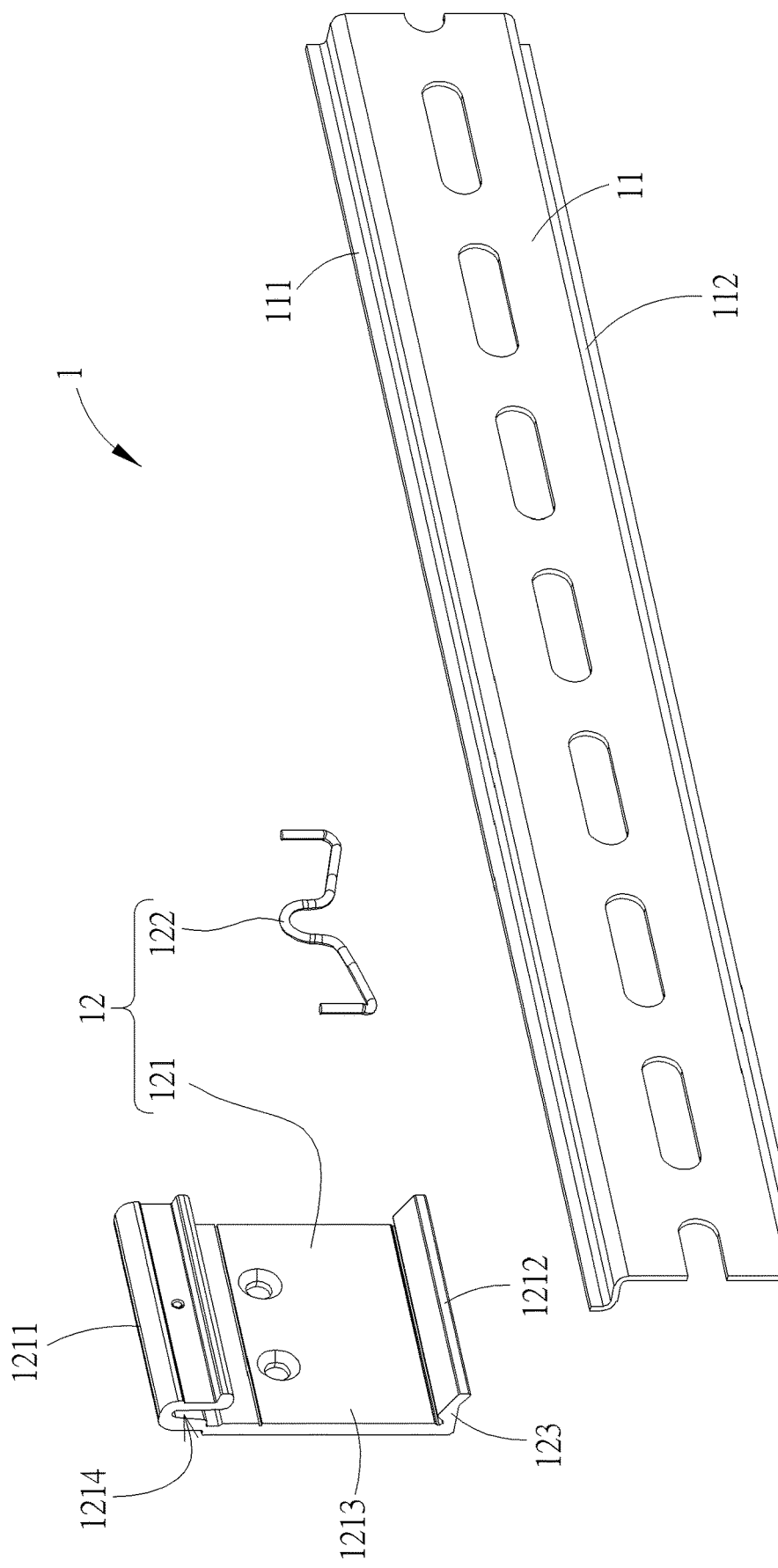
Figure 5:
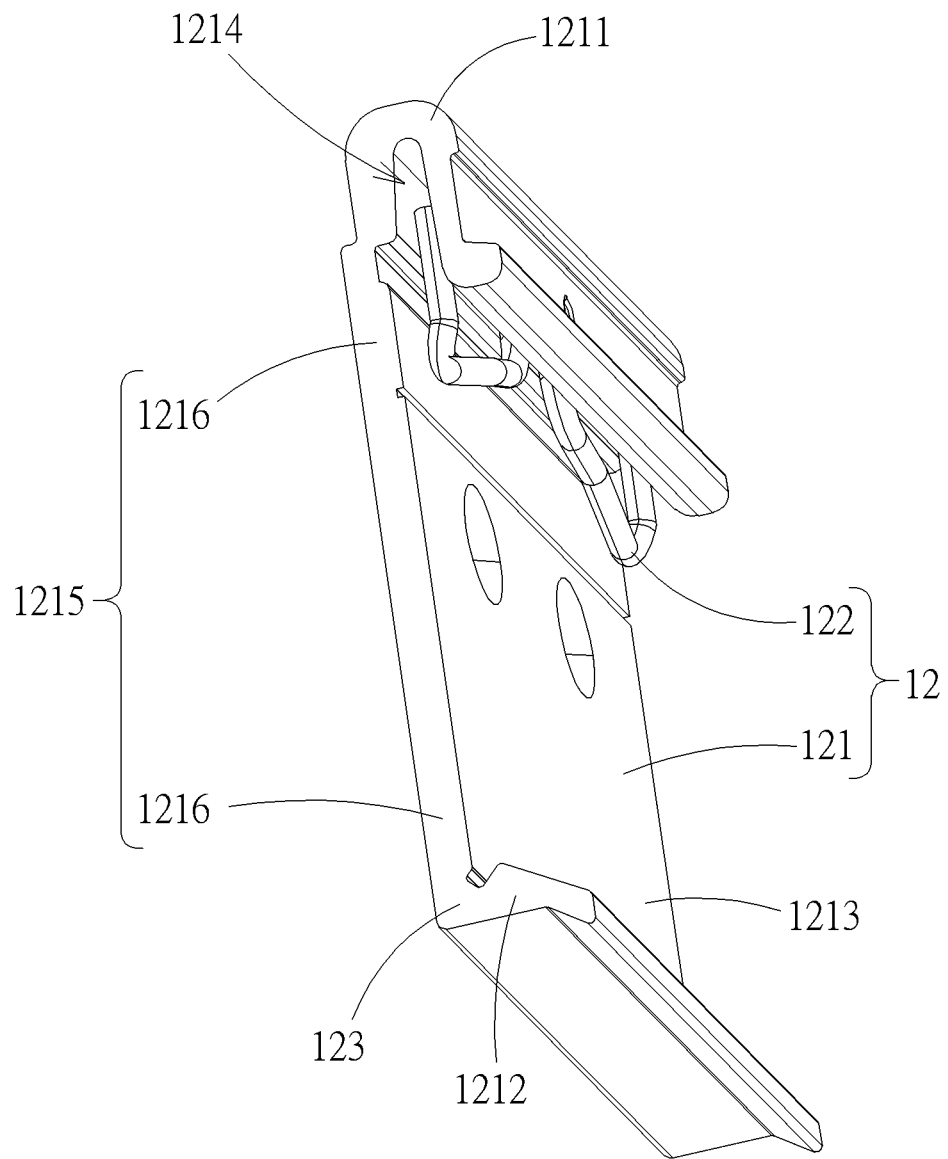
FIG. 5 is a partial diagram of a mounting kit according to the embodiment of the present invention.
Figure 6:
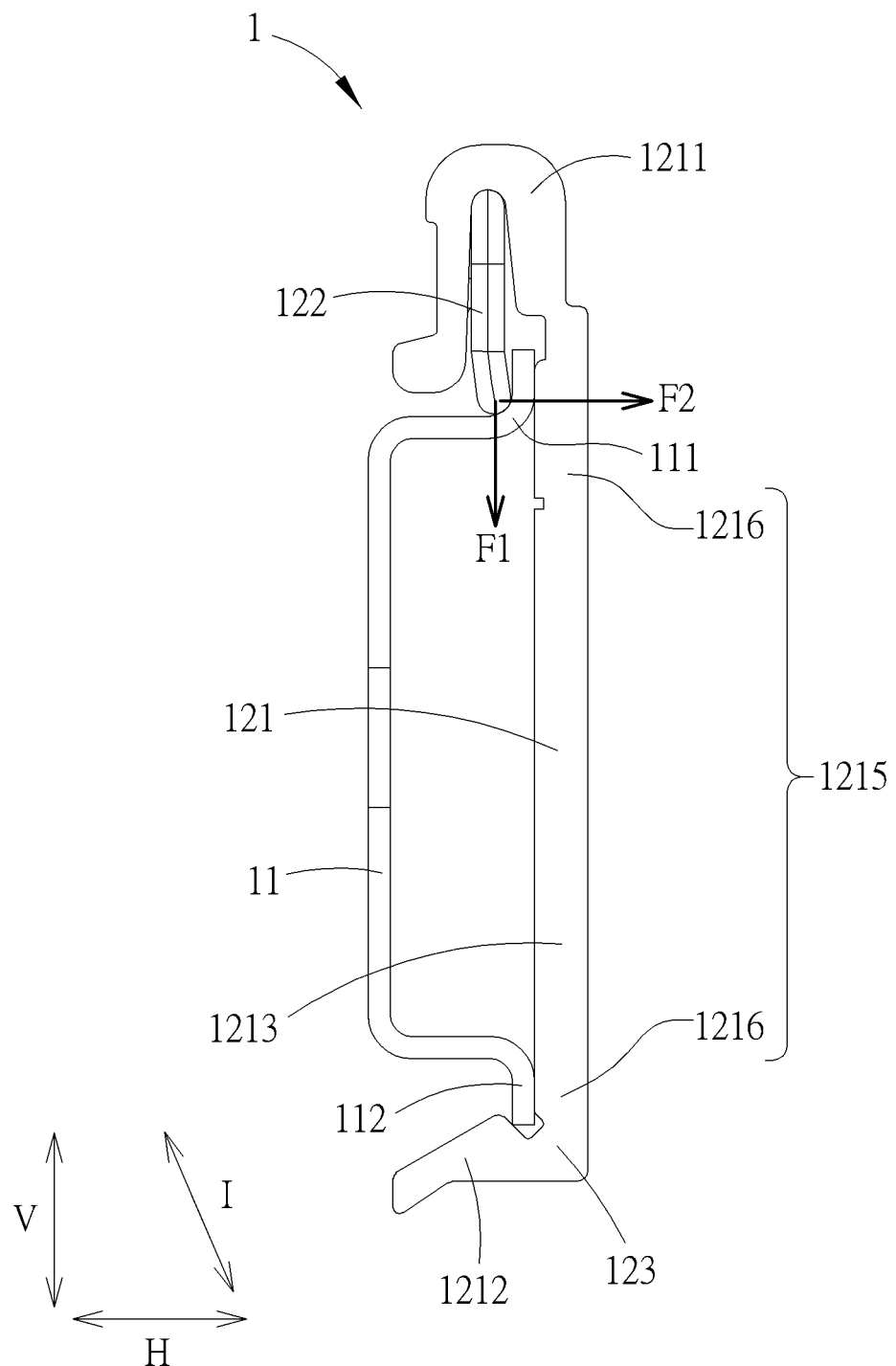
FIG. 6 is a lateral view diagram of the rail mounting system according to the embodiment of the present invention.

Please refer to FIG. 1 to FIG. 6. FIG. 1 and FIG. 2 are schematic diagrams of a rail mounting system 1 at different views according to an embodiment of the present invention. FIG. 3 and FIG. 4 are exploded diagrams of the rail mounting system 1 at different views according to the embodiment of the present invention. FIG. 5 is a partial diagram of a mounting kit 12 according to the embodiment of the present invention. FIG. 6 is a lateral view diagram of the rail mounting system 1 according to the embodiment of the present invention. As shown in FIG. 1 to FIG. 6, the rail mounting system 1 includes a rail component 11 and the mounting kit 12. The mounting kit 12 includes a mounting base 121, a resilient component 122 and an engaging structure 123. The mounting base 121 includes a first end portion 1211, a second end portion 1212 and a connecting portion 1213 connected to the first end portion 1211 and the second end portion 1212. Specifically, the first end portion 1211 and the second end portion 1212 can be an upper end portion and a lower end portion of the mounting base 121, respectively. However, the present invention is not limited to this embodiment. An accommodating slot 1214 is formed on the first end portion 1211 of the mounting base 121. The resilient component 122 is a one-piece structure and detachably and partially accommodated in the accommodating slot 1214. The engaging structure 123 is formed on the second end portion 1212 of the mounting base 121. At least one through hole or at least one screw hole is formed on the connecting portion 1213 for allowing a user to mount an appliance, such as a circuit breaker or a terminal block, onto the connecting portion 1213 by at least one fastening component, such as a bolt or a screw. When the mounting kit 12 is mounted on the rail component 11, the resilient component 122 is resiliently deformed by the rail component 11 and a wall of the accommodating slot 1214 to generate a vertical resilient component force F1 and a horizontal resilient component force F2, so as to drive the rail component 11 to engage with the engaging structure 123 along a vertical direction V by the vertical resilient component force F1 for preventing a shaking movement of the mounting kit 12 along the vertical direction V and to drive the rail component 11 to abut against the engaging structure 123 along a horizontal direction H by the horizontal resilient component force F2 for preventing a shaking movement of the mounting kit 12 along the horizontal direction H. The aforementioned configuration can effectively prevent resonance of the mounting kit 12, and therefore, the present invention has better structural reliability. In this embodiment, the rail component 11 can be a DIN rail and include a first flange 111 for cooperating with the resilient component 122 and a second flange 112 for engaging with the engaging structure 123. Specifically, the first flange 111 and the second flange 112 can be an upper flange and a lower flange of the rail component 11, respectively. However, the present invention is not limited to this embodiment.

Figure 7:
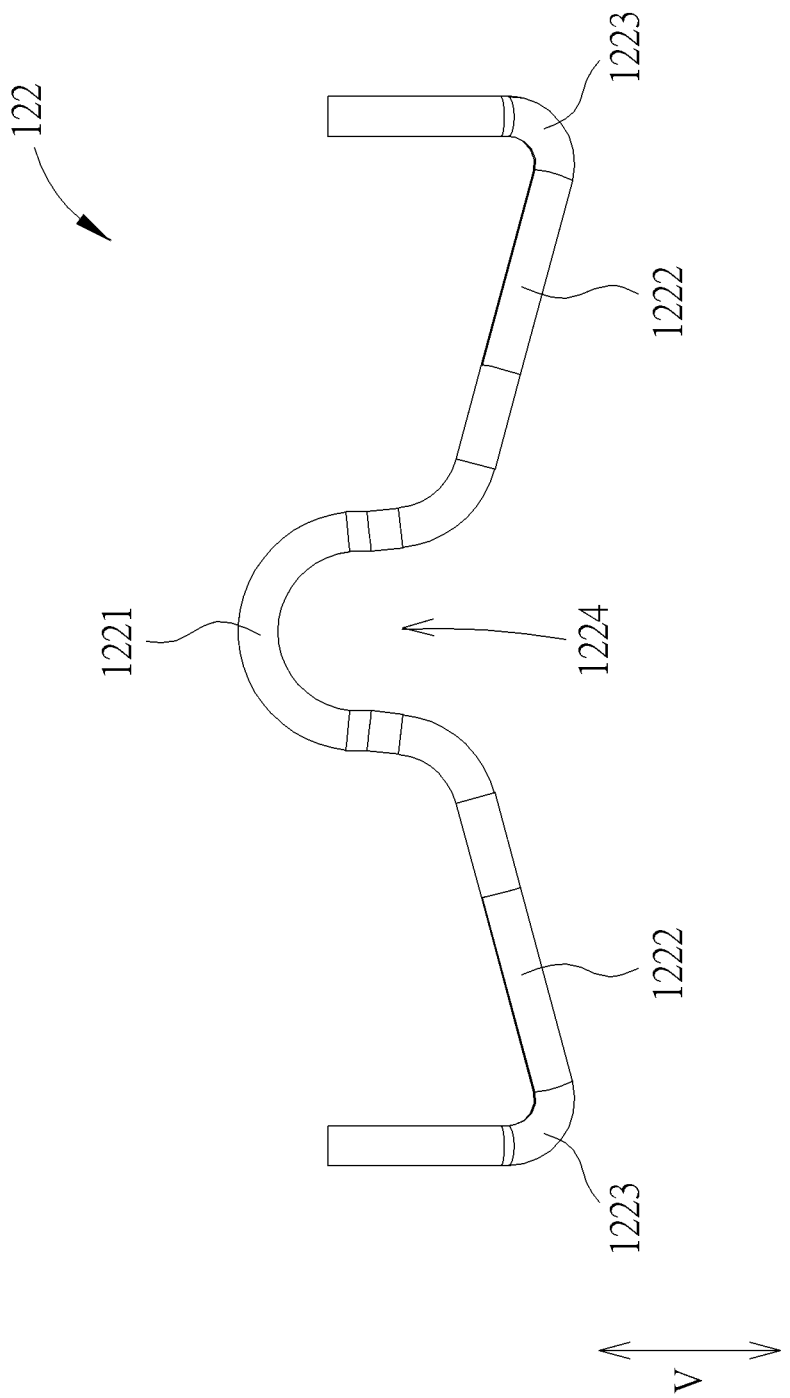
FIG. 7 to FIG. 9 are diagrams of a resilient component at different views according to the embodiment of the present invention.
Figure 8:
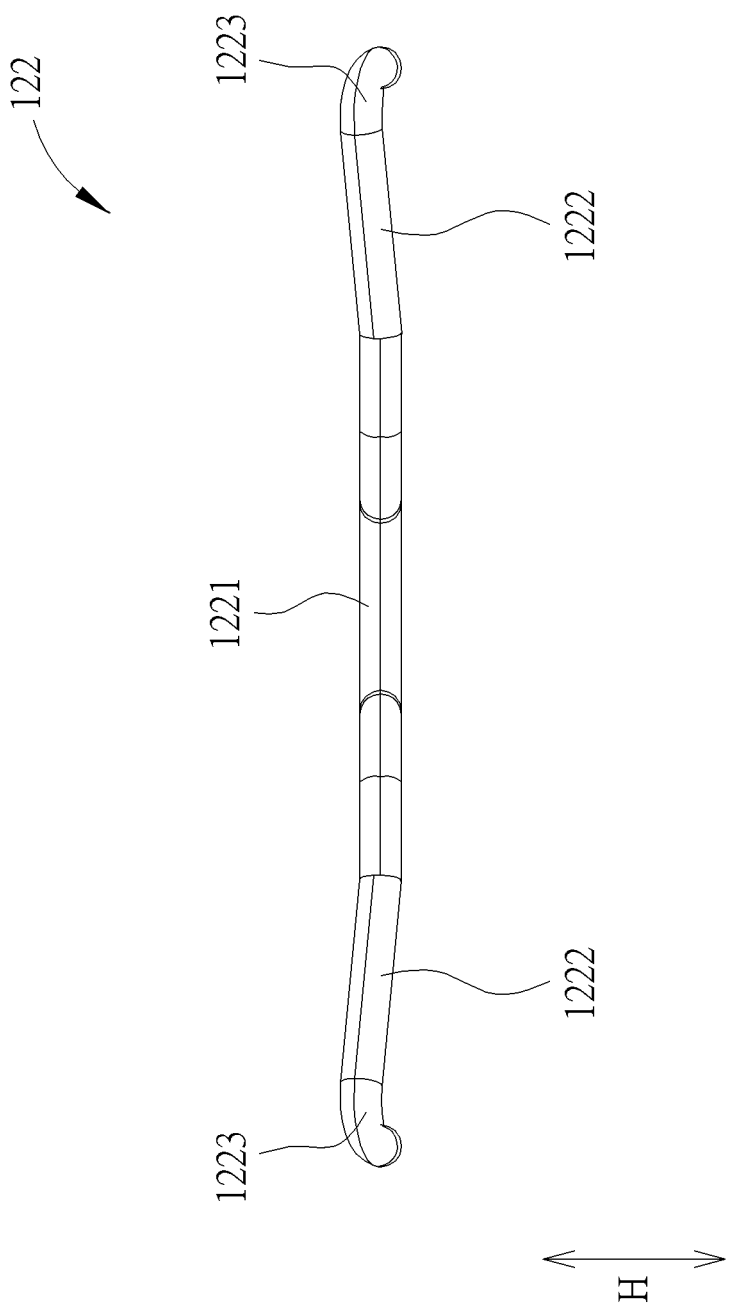
Figure 9:
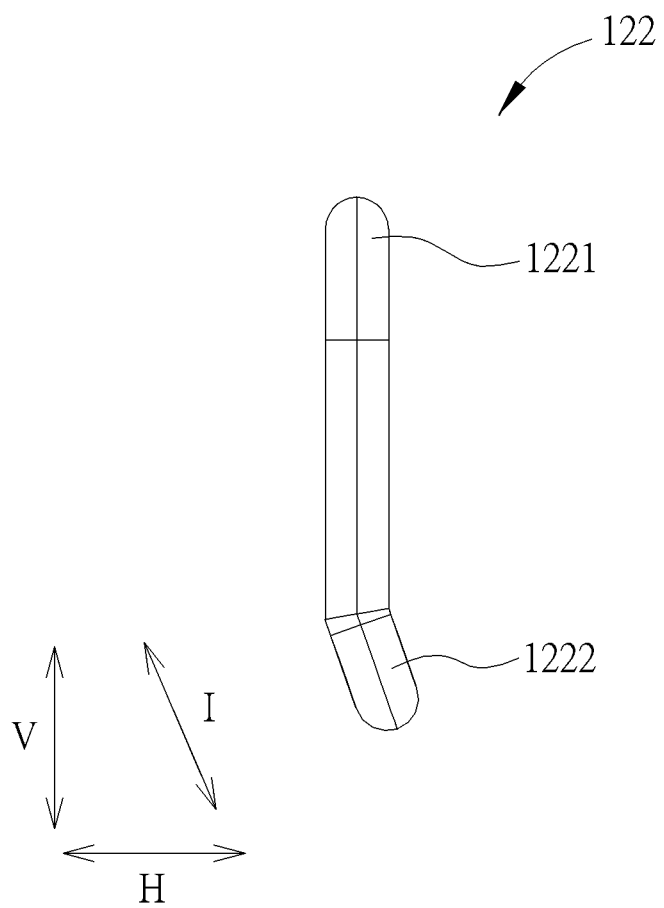

Please refer to FIG. 3 to FIG. 9. FIG. 7 to FIG. 9 are diagrams of the resilient component 122 at different views according to the embodiment of the present invention. As shown in FIG. 3 to FIG. 9, in this embodiment, the resilient component 122 includes an accommodating portion 1221 and two inclined extending portions 1222. The accommodating portion 1221 is located between and connected to the two inclined extending portions 1222. The accommodating portion 1221 is located in the accommodating slot 1214 and extends along the vertical direction V toward the engaging structure 123 or the second end portion 1212 of the mounting base 121. Each of the inclined extending portions 1222 extends along an inclined direction I inclined relative to the vertical direction V and the horizontal direction H toward the connecting portion 1213 of the mounting base 121. An abutting portion 1223 is formed on each of the inclined extending portions 1222 and for abutting against the rail component 11. When the mounting kit 12 is mounted on the rail component 11, the first flange 111 of the rail component 11 pushes the two inclined extending portions 1222, so that the resilient component 122 is resiliently deformed by the first flange 111 and the wall of the accommodating slot 1214. Since each of the inclined extending portions 122 extends along the inclined direction I, the resilient component 122 is resiliently deformed not only along the vertical direction V but also along the horizontal direction H. Therefore, the resilient component 122 can generate the vertical resilient component force F1 for driving the rail component 111 to engage with the engaging structure 123 along the vertical direction V and the horizontal resilient component force F2 for driving the rail component 11 to abut against the connecting portion 1213 along the horizontal direction H. However, the structure of the resilient component is not limited to this embodiment. Any structure which can generate the vertical resilient component force for driving the rail component to engage with the engaging structure along the vertical direction and the horizontal resilient component force for driving the rail component to abut against the connecting portion along the horizontal direction is included with the scope of the present invention. For example, in another embodiment, an extending direction of the accommodating portion can be inclined relative to the vertical direction. Alternatively, in another embodiment, the resilient component can include one inclined extending portion partially accommodated in the accommodating slot and extending toward the connecting portion along the inclined direction and does not include any accommodating portion.

Specifically, in this embodiment, a positioning block 1217 protrudes from the wall of the accommodating slot 1214. A positioning notch 1224 is formed on the accommodating portion 1221. Engagement of the positioning block 1217 and the positioning notch 1224 can position the accommodating portion 1221 in the accommodating slot 1214 for preventing disengagement of the accommodating portion 1221 from the accommodating slot 1214. For example, when it is desired to install the resilient component 122 in the accommodating slot 1214, the resilient component 122 can be placed in the accommodating slot 1214 and then the positioning block 1217 can be formed on the wall of the accommodating slot 1214 by stamping for achieving installation and positioning of the resilient component 122.

Preferably, in this embodiment, a projection length of each of the inclined extending portions 1222 along the horizontal direction H can be from 0.5 to 0.9 millimeters. For example, the projection length of each of the inclined extending portions 1222 along the horizontal direction H can be 0.7 millimeters. In such a way, the horizontal resilient component force F2 generated by the resilient component 122 can push the rail component 11 to abut against the connecting portion 1213 firmly and can be overcome without excessive effort for easy installation of the mounting kit 12.

Figure 10:
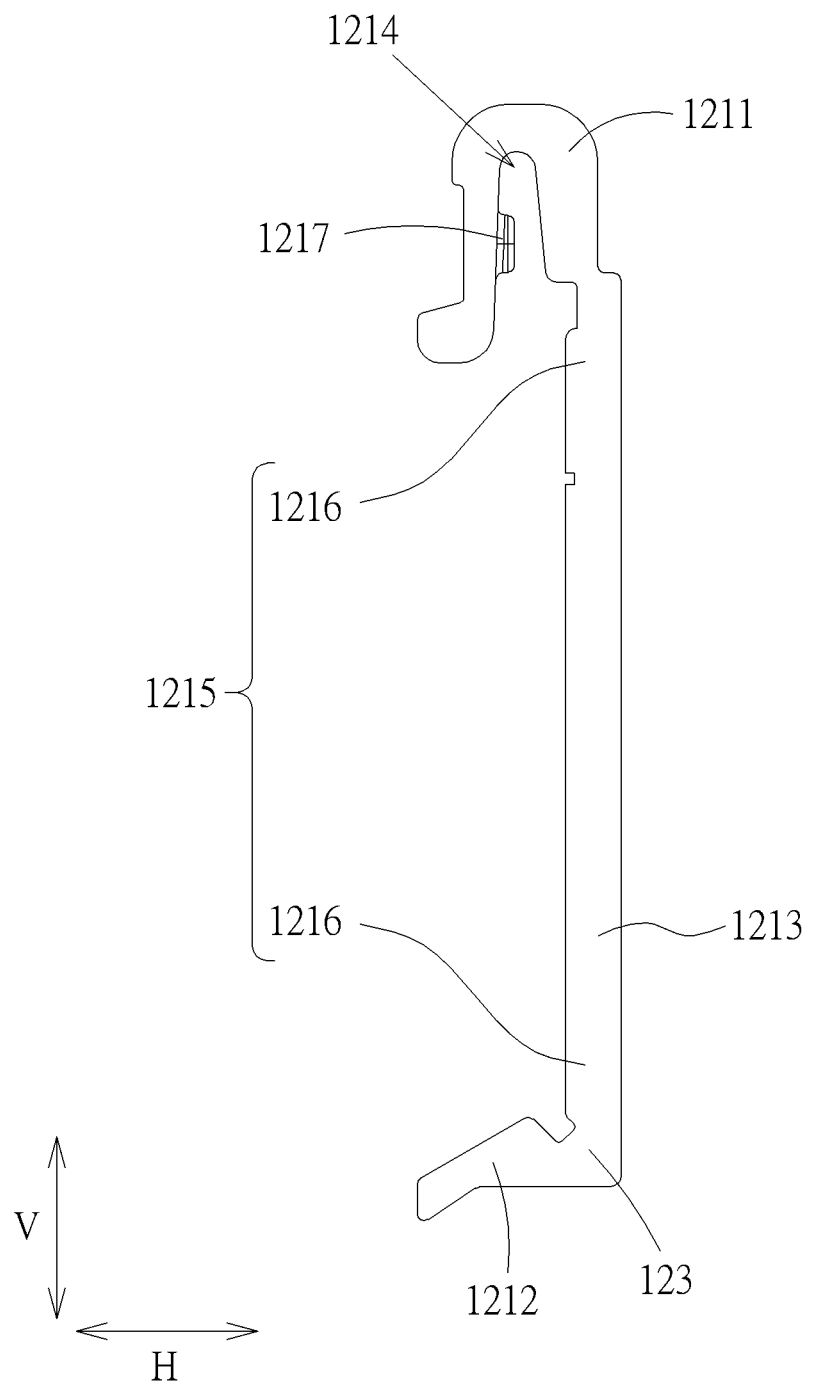
FIG. 10 is a lateral view diagram of a mounting base according to the embodiment of the present invention.

Furthermore, please refer to FIG. 3 to FIG. 6 and FIG. 10. FIG. 10 is a lateral view diagram of the mounting base 121 according to the embodiment of the present invention. As shown in FIG. 3 to FIG. 6 and FIG. 10, in this embodiment, the connecting portion 1213 includes an abutting structure 1215 protruding from a side of the connecting portion 1213 adjacent to the rail component 11 along the horizontal direction H and configured to abut against the rail component 11 along the horizontal direction H for preventing the shaking movement of the mounting kit 12 relative to the rail component 11 along the horizontal direction H.

Specifically, two abutting platforms 1216 are formed on the abutting structure 1215 and extend along the vertical direction V. The two abutting platforms 1216 can respectively abut against the first flange 111 and the second flange 112 of the rail component 11 along the horizontal direction H for allowing the first flange 111 and the second flange 112 of the rail component 11 to be aligned with each other along the vertical direction V and preventing movements of the first flange 111 and the second flange 112 of the rail component 11 relative to the rail component 11 along the horizontal direction H, so as to prevent the mounting kit 12 from being inclined relative to the rail component 11 and to prevent the shaking movement of the mounting kit 12 relative to the rail component 11 along the horizontal direction H. However, the present invention is not limited to this embodiment. For example, in another embodiment, an extending direction of the abutting platform can be inclined relative to the vertical direction, so that the mounting kit can be mounted on the rail component obliquely.

When it is desired to mount the mounting kit 12 on the rail component 11, the mounting kit 12 can be moved toward the first flange 111 of the rail component 11 from top to bottom to abut the abutting portions 1223 of the two inclined extending portions 1222 against the first flange 111 of the rail component 11. Afterwards, the mounting kit 12 can be pivoted to engage the second flange 112 of the rail component 11 with the engaging structure 123 for achieving installation of the mounting kit 12. When the mounting kit 12 is mounted on the rail component 11, the first flange 111 of the rail component pushes the two inclined extending portions 1222, so that the resilient component 122 is resiliently deformed by the first flange 111 and the wall of the accommodating slot 1214, so as to generate the vertical resilient component force F1 for driving the rail component 11 to engage with the engaging structure 123 along the vertical direction V and to generate the horizontal resilient component force F2 for driving the rail component 11 to abut against the connecting portion 1213 along the horizontal direction H. Therefore, the present invention can prevent the shaking movements of the mounting kit 12 relative to the rail component 11 along the vertical direction V and the horizontal direction H for preventing resonance of the mounting kit 12.

In contrast to the prior art, the present invention utilizes the resilient component for generating the vertical resilient component force and the horizontal resilient component force to drive the rail component to engage with the engaging structure along the vertical direction and to abut against the connecting portion of the mounting base along the horizontal direction, so as to prevent the shaking movements of the mounting kit relative to the rail component along the vertical direction and the horizontal direction. The aforementioned configuration can effectively prevent resonance of the mounting kit, and therefore, the present invention has better structural reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mounting kit adapted for a rail component, the mounting kit comprising:
    a mounting base comprising a first end portion, a second end portion and a connecting portion connected to the first end portion and the second end portion, an accommodating slot being formed on the first end portion of the mounting base;

a resilient component being a one-piece structure and partially accommodated in the accommodating slot in a detachable manner; and an engaging structure formed on the second end portion of the mounting base;

wherein when the mounting kit is mounted on the rail component, the resilient component is resiliently deformed by the rail component and a wall of the accommodating slot to generate a vertical resilient component force and a horizontal resilient component force, so as to drive the rail component to engage with the engaging structure along a vertical direction by the vertical resilient component force for preventing a shaking movement of the mounting kit along the vertical direction and to drive the rail component to abut against the engaging structure along a horizontal direction by the horizontal resilient component force for preventing a shaking movement of the mounting kit along the horizontal direction;

wherein the resilient component comprises at least one inclined extending portion extending toward the connecting portion along an inclined direction inclined relative to the vertical direction and the horizontal direction.

2. The mounting kit of claim 1, wherein the connecting portion comprises an abutting structure protruding from a side of the connecting portion adjacent to the rail component along the horizontal direction and configured to abut against the rail component along the horizontal direction.

3. The mounting kit of claim 1, wherein the resilient component further comprises an accommodating portion connected to the at least one inclined extending portion and extending along the vertical direction.

4. The mounting kit of claim 3, wherein the connecting portion comprises an abutting structure protruding from a side of the connecting portion adjacent to the rail component along the horizontal direction and configured to abut against the rail component along the horizontal direction.

5. The mounting kit of claim 1, wherein an abutting portion of the at least one inclined extending portion abuts against the rail component when the mounting kit is mounted on the rail component.

6. The mounting kit of claim 5, wherein the connecting portion comprises an abutting structure protruding from a side of the connecting portion adjacent to the rail component along the horizontal direction and configured to abut against the rail component along the horizontal direction.

7. The mounting kit of claim 1, wherein a projection length of the at least one inclined extending portion along the horizontal direction is from 0.5 to 0.9 millimeters.

8. The mounting kit of claim 7, wherein the connecting portion comprises an abutting structure protruding from a side of the connecting portion adjacent to the rail component along the horizontal direction and configured to abut against the rail component along the horizontal direction.

9. A rail mounting system comprising:
a rail component; and
a mounting kit for mounting on the rail component, the mounting kit comprising:
a mounting base comprising a first end portion, a second end portion and a connecting portion connected to the first end portion and the second end portion, an accommodating slot being formed on the first end portion of the mounting base;
a resilient component being a one-piece structure and partially accommodated in the accommodating slot in a detachable manner; and
an engaging structure formed on the second end portion of the mounting base;
wherein when the mounting kit is mounted on the rail component, the resilient component is resiliently deformed by the rail component and a wall of the accommodating slot to generate a vertical resilient component force and a horizontal resilient component force, so as to drive the rail component to engage with the engaging structure along a vertical direction by the vertical resilient component force for preventing a shaking movement of the mounting kit along the vertical direction and to drive the rail component to abut against the engaging structure along a horizontal direction by the horizontal resilient component force for preventing a shaking movement of the mounting kit along the horizontal direction;
wherein the resilient component comprises at least one inclined extending portion extending toward the connecting portion along an inclined direction inclined relative to the vertical direction and the horizontal direction.

10. The rail mounting system of claim 9, wherein the connecting portion comprises an abutting structure protruding from a side of the connecting portion adjacent to the rail component along the horizontal direction and configured to abut against the rail component along the horizontal direction.

11. The rail mounting system of claim 9, wherein the resilient component further comprises an accommodating portion connected to the at least one inclined extending portion and extending along the vertical direction.

12. The rail mounting system of claim 11, wherein the connecting portion comprises an abutting structure protruding from a side of the connecting portion adjacent to the rail component along the horizontal direction and configured to abut against the rail component along the horizontal direction.

13. The rail mounting system of claim 9, wherein an abutting portion of the at least one inclined extending portion abuts against the rail component when the mounting kit is mounted on the rail component.

14. The rail mounting system of claim 13, wherein the connecting portion comprises an abutting structure protruding from a side of the connecting portion adjacent to the rail component along the horizontal direction and configured to abut against the rail component along the horizontal direction.

15. The rail mounting system of claim 9, wherein a projection length of the at least one inclined extending portion along the horizontal direction is from 0.5 to 0.9 millimeters.

16. The rail mounting system of claim 15, wherein the connecting portion comprises an abutting structure protruding from a side of the connecting portion adjacent to the rail component along the horizontal direction and configured to abut against the rail component along the horizontal direction.

* * * * *